United States Patent
Cheng et al.

(10) Patent No.: US 6,255,203 B1
(45) Date of Patent: Jul. 3, 2001

(54) TECHNIQUE FOR LOW-TEMPERATURE FORMATION OF EXCELLENT SILICIDED α-SI GATE STRUCTURES

(75) Inventors: Huang-Chung Cheng; Wen-Koi Lai; Nan-Ching Chen, all of Hsinchu (TW)

(73) Assignee: National Science Council, Taipei (TW)

( * ) Notice: Subject to any disclaimer, the term of this patent is extended or adjusted under 35 U.S.C. 154(b) by 0 days.

(21) Appl. No.: 09/216,672

(22) Filed: Dec. 16, 1998

(30) Foreign Application Priority Data

Jan. 16, 1998 (TW) ................................................ 87100527

(51) Int. Cl.[7] ...................... H01L 21/20; H01L 21/3209; H01L 21/4763
(52) U.S. Cl. ............................................ 438/592; 438/584
(58) Field of Search ................................... 438/592, 584, 438/585, 630, 655, 682

(56) References Cited

U.S. PATENT DOCUMENTS

| | | | |
|---|---|---|---|
| 4,282,647 | * 8/1981 | Richman | ................................. 29/571 |
| 5,624,867 | * 4/1997 | Cheng et al. | ......................... 438/560 |
| 6,008,111 | * 12/1999 | Fushida et al. | ....................... 438/584 |
| 6,057,185 | * 5/2000 | Suenaga | ................................ 438/229 |

* cited by examiner

Primary Examiner—Richard Elms
Assistant Examiner—Adam Pyonin
(74) Attorney, Agent, or Firm—Chi-Ping Chang, Pacific Law Group LLP

(57) ABSTRACT

This application relates to a process to suppress the impurity diffusion through gate oxide on silicided amorphous-Si gate structures that utilize the silicide layers as the implantation barrier to minimize the impurity diffusion by reducing the projectile range and implant-induced defects, resulting in smaller flat-band voltage($V_{FB}$) shift and better characteristics of the breakdown field($E_{bd}$) and charge to breakdown ($Q_{bd}$). In addition, the amorphous-Si underlying layer is simultaneously kept during the formation of a low-temperature self-aligned silicide (SAD) process to further retard the impurity diffusion. Hence, the usage of such bilayered silicide/amorphous-Si films could effectively retard the impurity diffusion, by combining both effects of the amorphous-Si layer and the silicide process or inducing other undesirable effects such as the increase of gate sheet resistance.

7 Claims, 5 Drawing Sheets

TECHNIQUE FOR LOW-TEMPERATURE FORMATION OF EXCELLENT SILICIDED α-SI GATE STRUCTURES

FIELD OF THE INVENTION

This invention relates to a novel process for the fabrication of gate structure, and more particularly to a process suppressing the impurity diffusion through low temperature grown silicided A-Si gate and preventing the gate oxide from impurity penetration.

BACKGROUND OF THE INVENTION

CMOSFET, which consists n-type and p-type metal-oxide-semiconductor field effect transistors, is the essential component in the integrated circuit. As the size of the devices shrinks, it is required to replace the n-type polysilicon gate with its p-type conterpart in order to create surface channel on the p-type MOSFET. The replacement can reduce both the short channel effect and hot carrier effect. In practice, $BF_2^+$ is implanted to form p-type polysilicon gate and source/drain shallow junction. Unfortunately, fluorine speeds up the diffusion of boron ions in the gate oxide. Consequently, the boron ions reach the silicon substrate and the electric properties and the reliability of the device are deteriorated. For examples, the breakdown field and the charge to breakdown can get smaller and the charge trapping rate of the gate oxide can be increased.

According to the report in IEEE Electron Device Lett. Volume EdL-14, page 179, by G. W. Yoon etc., nitrogen in the gate oxide can stop the penetration of boron ions and is therefore used in the growth of gate oxide. In addition, according to the report in IEEE Electron Device Lett. Volume 15, page 109, U.S. patent application Ser. No. 179,016 and Ser. No. 336,970 by Z. J. Ma etc., $NH_3$ is used during the anneal process of the gate oxide. The electric properties of the gate oxide by the process deteriorate while the reliability of the gate oxide by the process also deteriorates due to the incorporation of the hydrogen. Moreover, according to the report in IEEE Trans. Electron Devices Volume 42, page 1503 by C. Y. Lin, stacked p-type polysilicon (or silicon) gate structure increases the sheet resistance which is harmful to the operation of high speed devices.

SUMMARY OF THE INVENTION

In accordance with the present invention, a novel process forms silicide at low temperature while the underlying-Si gate remain amorphous. The silicide can be used as implantation barrier to narrow the implantation profile in the gate. During high temperature anneal process, the silicide can serve as an impurity diffusion source. Because the amorphous silicon can retard the impurity diffusion more efficiently than the polysilicon, the impurity can hardly penetrate the gate oxide to reach the silicon substrate. The integrity of the gate oxide is maintained. By the way, amorphous silicon forms smoother interface than polysilicon. Due to the properties mentioned above, the breakdown field and the charge to breakdown can increase. The properties and the reliability of the devices can thus be improved. As the thickness of the gate shrinks, the process in the present invention can provide more tolerance.

Important technical advantage of the present invention is that the present invention can be applied on both n-type and p-type gate structures, especially on the p-type gate structure. It is known that the diffusion rate of the boron ion in the gate is fast and it is even faster when fluorine is present in the gate oxide. The electrical properties and the reliability of the p-type gate can therefore be deteriorated. The present invention can retard the diffusion of the boron so that the properties of the p-gate is reserved.

Other important technical advantages are readily apparent to one skilled in the art from the following figures, descriptions, and claims.

BRIEF DESCRIPTION OF THE DRAWINGS

For more complete understanding of the present invention, and for further features and advantages, reference is now made to the following description taken in conjunction with the accompanying drawings, in which.

DETAILED DESCRIPTION OF THE INVENTION

Figure 1:
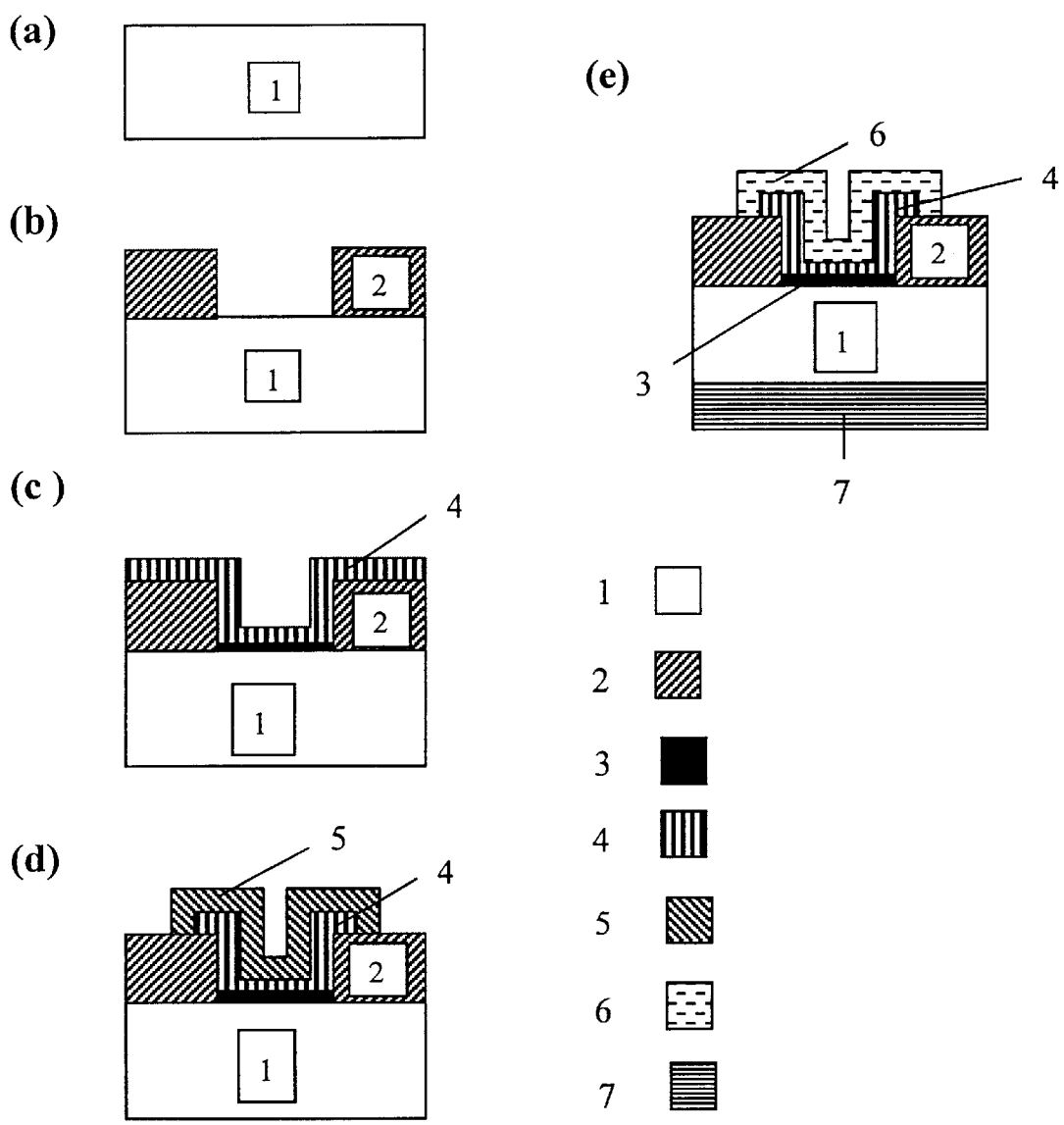
FIGS. 1(a)–(e) show the fabrication of the device in the present invention.

This invention relates to the fabrication of superior gate structure utilizing low temperature formation of silicide on A-Si. In order to reduce the contact resistance of the α-Si (or poly-Si) gate, silicide is deposited or thermally grown. After annealing at high temperature, polycide gate structure is formed. Self-aligned silicide can be formed at temperature as low as 100–500° C. by deposition. In addition to the formation of self-aligned silicide, the underlying layer remains amorphous after the first-step silicidation. This helps to form smoother and thermally stable silicide after annealing at high temperature. On the other hand, the A-Si layer can retard the fast diffusion of the impurities. Metals qualified in the process include Co, Ni, Pd, Pt, and Ti.

In forming n- and p-gate by the implantation of $P^+$, $As^+$, $B^+$, $BCl^+$, and $BF_2^+$, the incorporation of silicide, used as an implantation barrier, can effectively retard the fast diffusion of the impurities into the gate oxide and therefore improves device reliability. Moreover, silicided shallow junction of source/drain can also be formed in the same process which forms polycide gate structure.

The underlying A-Si remains amorphous while the low temperature growth of silicide. The silicide layer can serve as an implantation barrier to narrow the implantation profile in the gate. Moreover, the silicide layer can be used as an impurity diffusion source in the anneal process wherein numeral 1 designates Si substrate, numeral 2 designates field oxide, numeral 3 designates gate oxide, numeral 4 designates A-Si or poly-Si gate, numeral 5 designates CoSi film, numeral 6 designates $CoSi_2$ film, and numeral 7 designates Al. In the mean time, the underlying A-Si can retard the impurity diffusion more efficiently than poly-Si. Because the implanted impurity can hardly penetrate the gate oxide to reach the Si substrate, the integrity of the gate oxide is maintained. In addition, A-Si 238 can result in smoother interface than poly-Si in the high temperature process. All the properties mentioned above lead to high breakdown field($E_{bd}$) and breakdown charge($Q_{bd}$). The reliability and the device performance can also been improved. While the thickness of the gate oxide is shrinking, the process in the present invention widens the process tolerance.

The fabrication process comprises:

(a) Si substrate: n-type (100), and 3–5 Ω-cm.
(b) field oxide, 4500 Å at 1000° C.; first mask and patterning.
(c) gate oxide, 80 Å at 900° C.; LPCVD growth of poly-Si/A-Si, 1000 Å.
(d) second mask and patterning; e-beam sputtered Mo/Co film, 180/135 Å; RTA at 450° C. for 60 sec to form CoSi; selective etching of Mo and unreacted Co.
(e) implantation of $BF_2^+$, 55 keV, $5 \times 10^{15}$ cm$^{-2}$; annealing at 700° C., 800° C., and 900° C. for 60 sec respectively and at 1000° C. for 30 sec; depositing 4500 Å Al on the backside of the Si substrate.

The process can be applied on both n- and p-gate structure, but especially on p-gate. This is because that the diffusion of $B^+$ in the gate is fast and the presence of F induces even fast diffusion of $B^+$ in the gate oxide. Hence the electrical property and the reliability of the p-gate is deteriorated. The process in the present invention can retard the diffusion of $B^+$ and consequently superior p-gate structure is obtained.

FIGS. 1(a)–(e) shows the phases in the fabrication process:

(a) prepare n-type substrate (100), 3–5 Ω-cm.
(b) field oxide, 4500 Å, 1000° C.; first mask and patterning.
(c) gate oxide, 80 Å, 900° C.; LPCVD poly Si and A-Si, 1000 Å.
(d) second mask and patterning; e-beam sputtering Mo/Co thin film, 180/135 Å; RTA at 450° C. for 60 sec to form CoSi; selective etch Mo and unreacted Co.
(e) $BF_2^+$ implantation, 55 eV, $5 \times 10^{15}$ cm$^{-2}$; RTA at 700° C., 800° C., 900° C. for 60 sec and 1000° C. for 30 sec; deposit 4500 Å Al on the backside of the substrate.

Detail description of the device fabrication (for CoSi/poly, CoSi/α-Si):

(1) substrate, n-type, 3–5 Ω-cm.
(2) field oxide, 1000° C., 4500 Å.
(3) first mask and pattern.
(4) gate oxide, 900° C., 80 Å.
(5) LPCVD poly-Si (or A-Si), 1000 Å.
(6) second mask and pattern.
(7) e-beam sputtering Mo/Co film, 180/135 Å.
(8) CoSi, 450° C. RTA, 60 sec.
(9) selective etching of Mo and unreacted Co.
(10) $BF_2^+$ implantation, 55 keV, $5 \times 10^{15}$ cm$^{-2}$.
(11) 700° C., 800° C., 900° C. RTA for 60 sec, 1000° C. RTA for 30 sec.
(12) deposit Al on the backside of the substrate, 4500 Å.

Device fabrication as a comparison (poly-Si):

(a) substrate, n-type, 3–5 Ω-cm.
(b) oxide, 1000° C., 4500 Å; first mask and pattern.
(c) gate oxide, 900° C., 80 Å; LPCVD poly-Si, 1000 Å.
(d) $BF_2^+$ implantation, 40 keV, $5 \times 10^{15}$ cm$^{-2}$; second mask and pattern; e-beam sputtering Mo/Co film, 180/135 Å; CoSi, 450° C. RTA, 60 sec; selective etching of Mo and unreacted Co.
(e) 700° C., 800° C., 900° C. RTA for 60 sec, 1000° C. RTA for 30 sec; deposit Al on the backside of the substrate, 4500 Å.

The ability to stop the penetration of $B^+$ for metal silicide and α-Si gate is shown. Three different configurations are compared: poly-Si, CoSi/poly-Si, and CoSi/α-Si.

Figure 2:
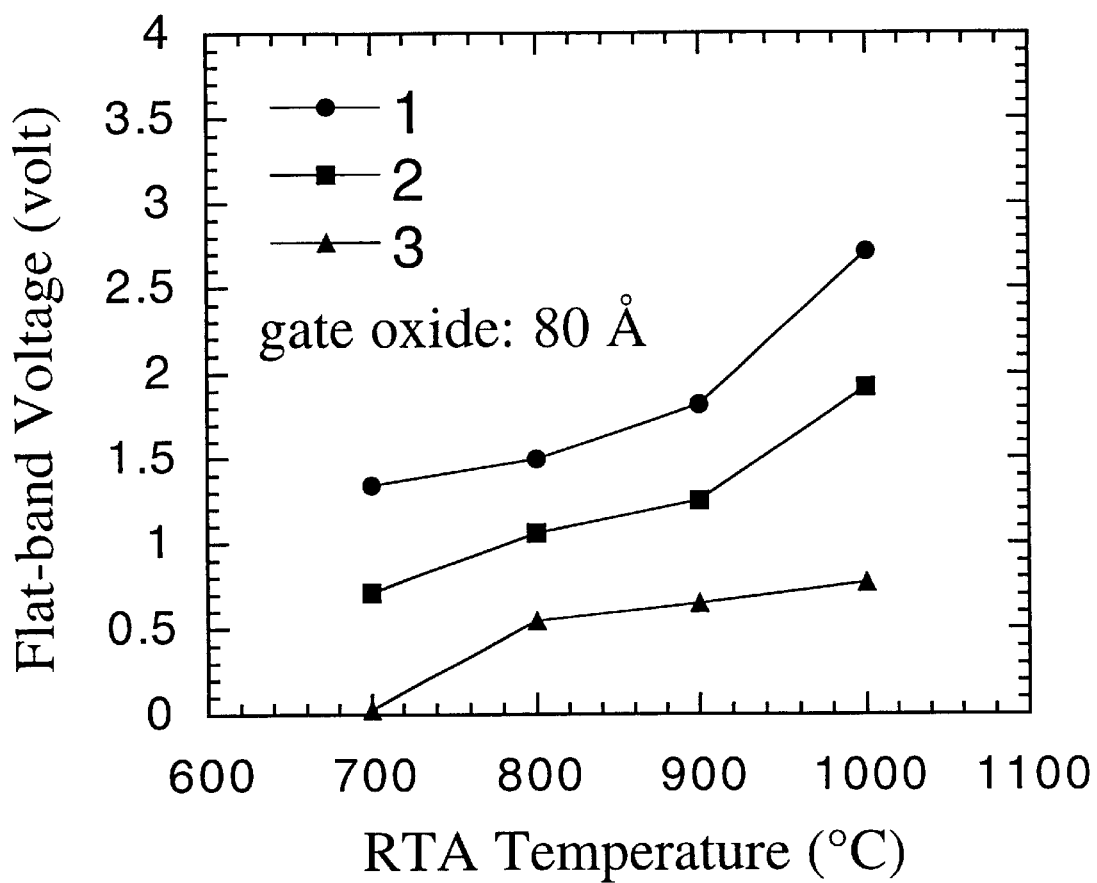
FIG. 2 shows the relation between the flat-band voltage and the annealing temperature.

FIG. 2 shows the relations between the flat-band voltage and the annealing temperature wherein numeral 1 designates poly-Si, numeral 2 designates CoSi/poly-Si, and numeral 3 designates CoSi/A-Si, gate oxide. The variation of the flat-band voltage is the smallest for the CoSi/A-Si group. The results imply that less Bions penetrate the gate oxide reaching the substrate.

Figure 3:
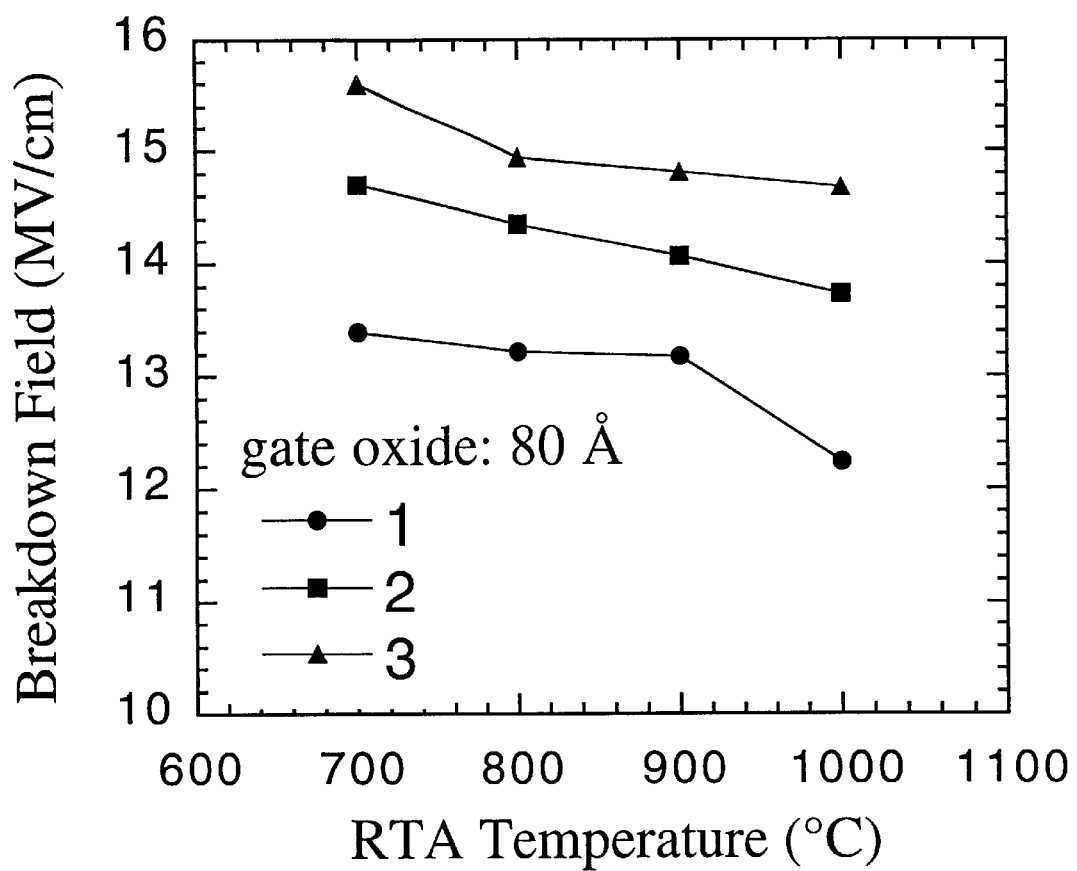
FIG. 3 shows the relation between the breakdown field and the annealing temperature.
Figure 4:
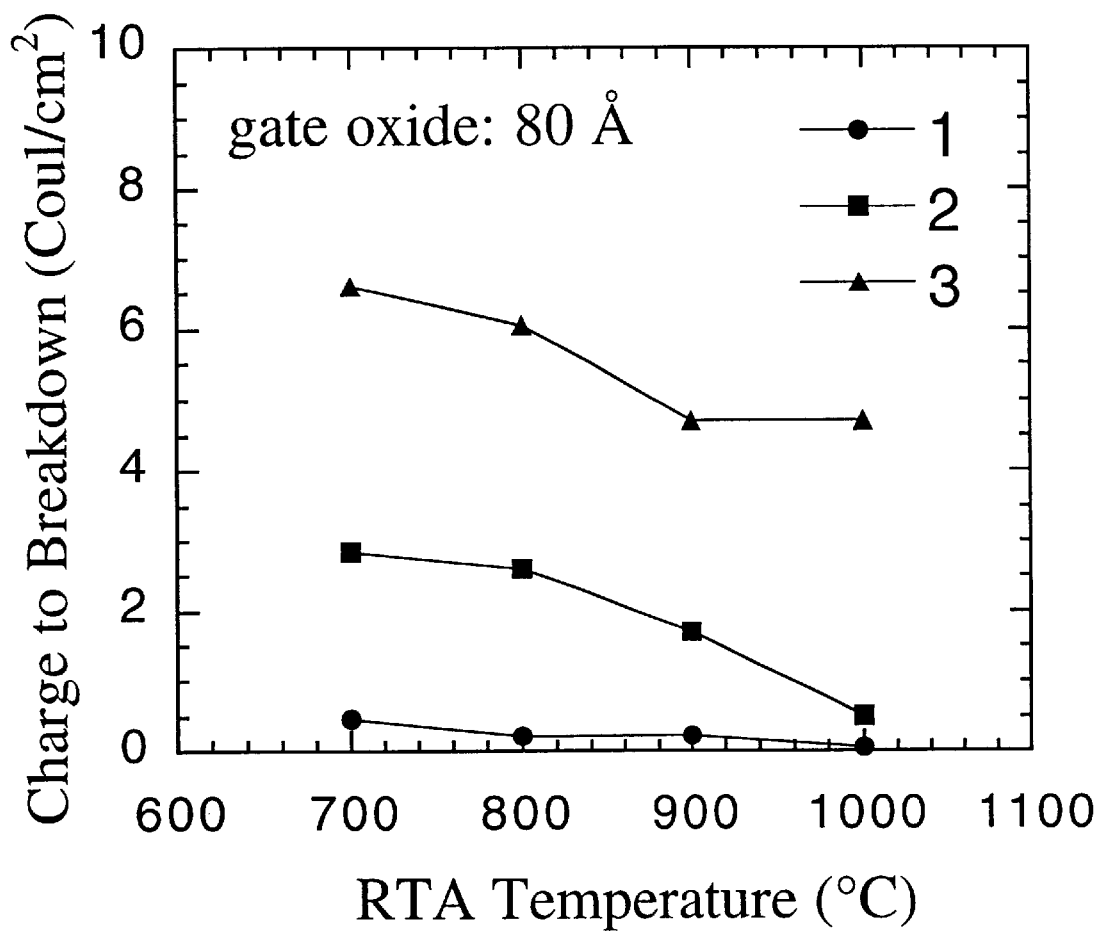
FIG. 4 shows the relation between the charge to breakdown and the annealing temperature.

FIGS. 3 and 4 shows the relation between the breakdown field, the charge to breakdown and the annealing temperature respectively wherein numeral 1 designates poly-Si, numeral 2 designates CoSi/poly-Si, and numeral 3 designates CoSi/A-Si, gate oxide. The results show that the $E_{bd}$ and $Q_{bd}$ for CoSi/A-Si group are the largest at various annealing temperature, which means that the gate oxide has good electrical properties and reliability.

Figure 5:
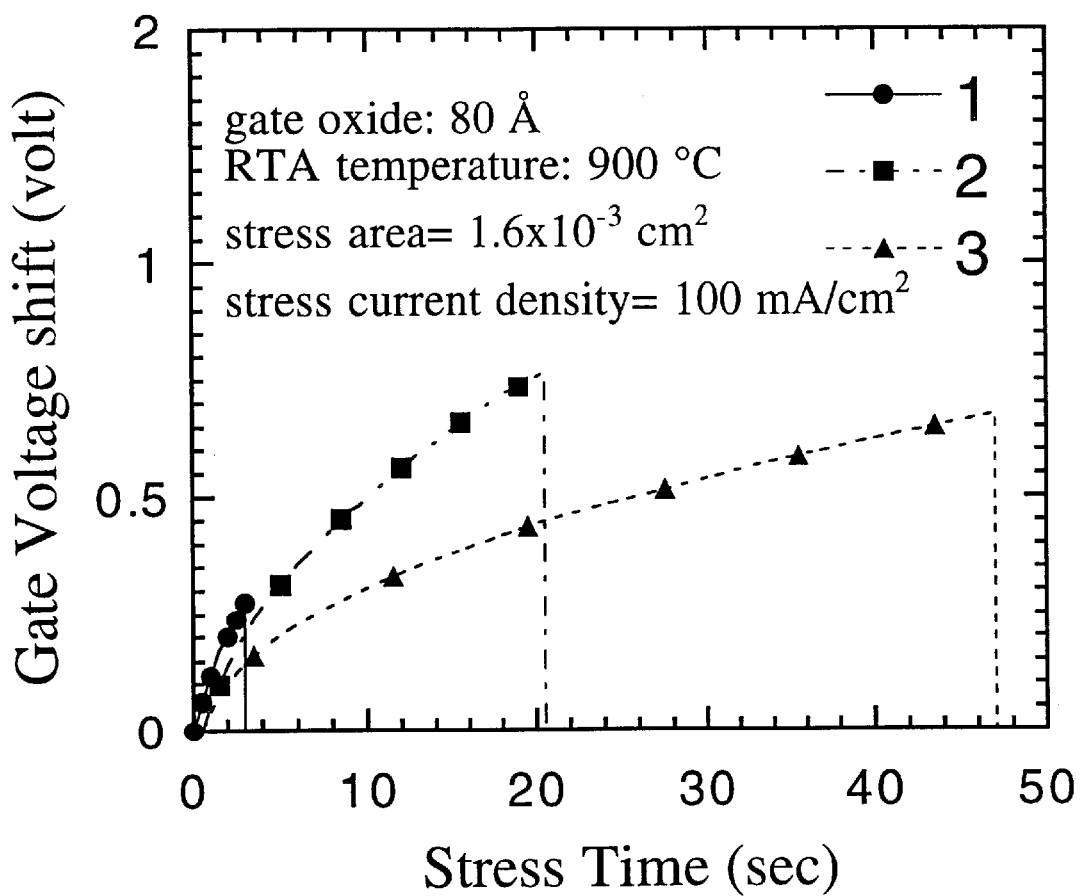
FIG. 5 shows the relation between the gate voltage and the time while the current is fixed at 100 mA/cm$^2$.

FIG. 5 shows the relation between the gate voltage and the time while the current is fixed at 100 mA/cm$^2$, wherein numeral 1 designates poly-Si, numeral 2 designates CoSi/poly-Si, and numeral 3 designates CoSi/A-Si the electron trapping rate is smaller for CoSi/α-Si group.

According to the data, the incorporation of CoSi/α-Si as the implantation barrier can reduce the penetration of B through gate oxide and lead to superior electrical properties and high reliability.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the spirit and scope of the appended claims.

What is claimed is:

1. A method for the fabrication of a silicide gate structure on A-Si, comprising:
    forming the gate structure on an upper region of a silicon substrate;
    growing the A-Si layer on the gate structure;
    forming under low temperature a self-aligned silicide on an upper surface of the A-Si;
    forming an impurity diffusion layer on an upper surface of the self-aligned silicide; and
    wherein the self-aligned silicide is formed while the A-Si remains amorphous to suppress the impurity diffusion.

2. As the method in claim 1, a metal layer is used as implantation barrier in the formation of the gate structure wherein the gate structure may be either a n- or p-gate structure formed by $P^+$, $As^+$, $B^+$, $BCl^+$, and $BF_2^+$ implantation to retard the impurity diffusion.

3. As the method in claim 2, the self-aligned silicide is formed by depositing at temperature as low as 100~500 while the underlying A-Si remains amorphous, in which the metals include Co, Ni, Pd, Pt, and Ti.

4. As the method in claim 3, polycide gate structure and source/drain silicide are formed by annealing at 400~1000.

5. As the method in claim 1, self-aligned silicide is formed by depositing at temperature as low as 100~500 while the underlying A-Si remains amorphous, in which the metals include Co, Ni, Pd, Pt, and Ti.

6. As the method in claim 5, low temperature grown silicide is used as implantation barrier in the formation of a n- or p-gate structure by $P^+$, $As^+$, $B^+$, $BCl^+$, and $BF_2^+$ implantation to retard the impurity diffusion and to prevent the impurity from penetrating the gate.

7. As the method in claim 6, polycide gate structure and source/drain silicide are formed by annealing at 400~1000.

* * * * *